United States Patent [19]

Jourdain et al.

[11] 4,442,966
[45] Apr. 17, 1984

[54] METHOD OF SIMULTANEOUSLY MANUFACTURING MULTIPLE ELECTRICAL CONNECTIONS BETWEEN TWO ELECTRICAL ELEMENTS

[75] Inventors: Philippe Jourdain, Evreux, France; Georges E. Florens, deceased, late of Cierrey, France; Georges A. L. Souquet, representative, Paris, France

[73] Assignee: U.S. Philips Corporation, New York, N.Y.

[21] Appl. No.: 311,211

[22] Filed: Oct. 14, 1981

[30] Foreign Application Priority Data

Oct. 15, 1980 [FR] France .............................. 80 22083

[51] Int. Cl.³ .............................................. B23K 31/00
[52] U.S. Cl. ................................ 228/123; 228/180 A
[58] Field of Search .................. 228/180 A, 123, 120; 156/307.5

[56] References Cited

U.S. PATENT DOCUMENTS 3,463,698 8/1969 Yanagihara ...................... 156/307.5
3,697,308 10/1972 Lubowitz .......................... 156/307.5
4,127,699 11/1978 Aumiller ............................ 252/514
4,147,669 4/1979 Shaheen ............................. 252/514
4,233,103 11/1980 Shaheen ............................. 228/123

FOREIGN PATENT DOCUMENTS 1525148 9/1978 United Kingdom .

Primary Examiner—Nicholas P. Godici
Assistant Examiner—Marc Hodak
Attorney, Agent, or Firm—Thomas A. Briody; Robert T. Mayer; Steven R. Biren

[57] ABSTRACT

A method for the simultaneous manufacture of multiple electrical connections, in particular for the electrical connection of semiconductor elements. In the method a conductive paste is used. Because the conductive paste would otherwise provide a poor electrical connection with the contact pads which are manufactured of certain metals, the paste is first polymerized and thermocompression of the paste is then carried out on the contact pad by the simultaneous application of pressure and a rise in temperature so that the paste forms a readily conductive and reliable connection.

4 Claims, 3 Drawing Figures

1

METHOD OF SIMULTANEOUSLY MANUFACTURING MULTIPLE ELECTRICAL CONNECTIONS BETWEEN TWO ELECTRICAL ELEMENTS

BACKGROUND OF THE INVENTION

The invention relates to a method of simultaneously manufacturing multiple electrical connections between two elements each provided with metallizations, the contact pads of one element, which are destined to be electrically connected to those of the other element, being designed so that, when the elements are provided oppositely to each other in a given position, each contact pad supported by one of the elements is present opposite the corresponding contact pad of the other element, with a given quantity of an electrically conductive paste being provided on each contact pad of at least one of the two elements.

The invention is used in the electronic industry, for example, for the assembly of semiconductor elements. The connection of a semiconductor element on a substrate of a hybrid circuit or a comb of conductors may be done in a known manner by providing the semiconductor element on the substrate or the comb in such manner that their contact pads lie opposite to each other and by providing a given quantity of a conductive paste, generally an epoxy resin filled with silver or gold particles, between each contact pad of the semiconductor element and the corresponding one of the substrate or the comb, after which the paste is polymerized, for example by heating.

Such a method is known from British Pat. No. 1,525,148, which describes a bonding method for an integrated circuit on a substrate by means of a drop of a conductive glue on each contact pad of the integrated circuit. This patent specification further describes that with aluminum contact pads the aluminum oxide on said pads should previously be removed at least partly. Since the contact pads generally are of aluminum, this problem is very annoying. After a certain period of storage it is found that the oxide which had been removed has formed again, no doubt because either the glue did not seal or because it was self-oxidizing, or both. Of course this involves an interruption of the bond and the creation of a defect.

In order to avoid this inconvenience, the aluminum contact pads must be treated in one or more chemical, physical-chemical or electrochemical treatments in such manner that a metal or an alloy compatible with the conductive glue is deposited on the pads. The advantage of the bonding method, however, then is lost for the greater part because of the rejects which it involves, as well as the costs of the treatments.

SUMMARY OF THE INVENTION

The method according to the invention yields a durable, high-quality contact between a conductive paste and aluminum pads, and this method makes it unnecessary to remove the aluminum oxide.

The invention is based on the concept of making, after the normal polymerization of the conductive paste, an intermetallic bond between the conductive particles in the hardened paste and the surface of the contact pad by simultaneous application of mechanical pressure and rise in temperature. The temperature at which the polymerized conductive paste is heated initially causes a certain softening, and the pressure used causes the formation of the electric connection by a phenomenon which is analogous to that of thermo-compression. An oxide skin, if any, on the contact pads is then pierced.

The method according to the invention is characterized in that first the polymerization of the conductive paste is produced and that the polymerized conductive paste is then compressed between each contact pad of an element and the corresponding contact pad of the other element, at least one of the two elements being heated.

BRIEF DESCRIPTION OF THE DRAWING

The invention will now be described in greater detail, by way of example, with reference to the accompanying drawing, in which.

The three Figures show three successive steps of the method.

DESCRIPTION OF THE PREFERRED EMBODIMENTS

Figure 1:
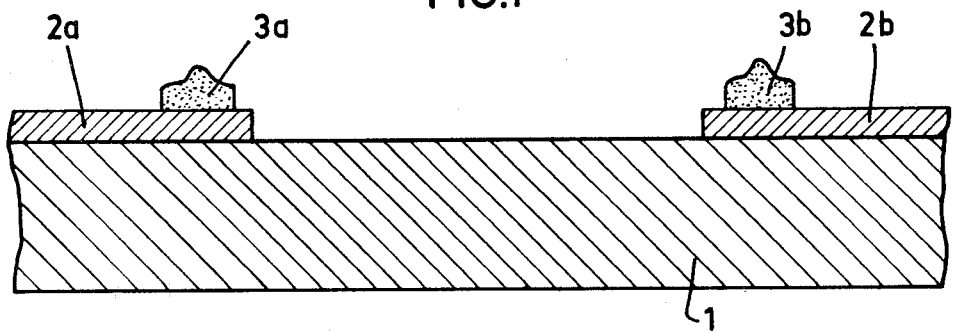
FIG. 1 is a sectional view of a substrate provided with drops of non-polymerized conductive paste.

The example described is that of the assembly of a semiconductor crystal, for example an integrated circuit, on an insulating substrate for a hybrid circuit. This insulating substrate is of ceramic material and comprises conductors of, for example, gold obtained by means of a photoetching process. The gold conductors are present on adhesive layers, for example of nickel and of nickel-chromium, obtained by means of known methods. FIG. 1 shows such a substrate 1 having two gold-plated metallizations 2a and 2b which form contact pads.

A given quantity of conductive paste 3a and 3b is provided on each of said contact pads 2a and 2b. One such conductive paste which may be used successfully is the paste known by the trade name EPOTEK H44, which is an epoxy resin filled with gold particles. Other pastes are also suitable, for example, an epoxy resin having silver particles. The provided quantity is determined experimentally in such manner that the paste which, before hardening, first becomes slightly liquid during the warm-polymerization and starts flowing, forms a kind of drop having substantially the same dimensions as the contact pad. Providing and dosing said paste is preferably carried out by silk-screening on a plate having a multiple of substrates to be separated afterwards. The silk-screening pattern consists of a metal foil having a thickness of approximately 20 micrometers in which square holes are provided by photo-etching having sides of approximately 80×80 micrometers. This plate is adhered to the gauze of a known silk-screening machine for hybrid circuits.

Figure 2:
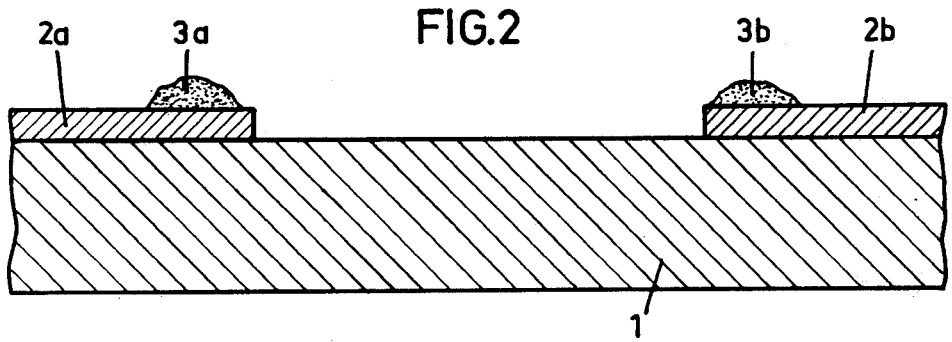
FIG. 2 is the same sectional view after warm polymerization of the conductive paste.

FIG. 2 shows the substrate 1 after the conductive paste has polymerized. In the case of the above-mentioned paste the polymerization is carried out at 150° C. for one hour. As explained above the paste 3a and 3b flows slightly and is rounded and after the polymerization is hard.

Figure 3:
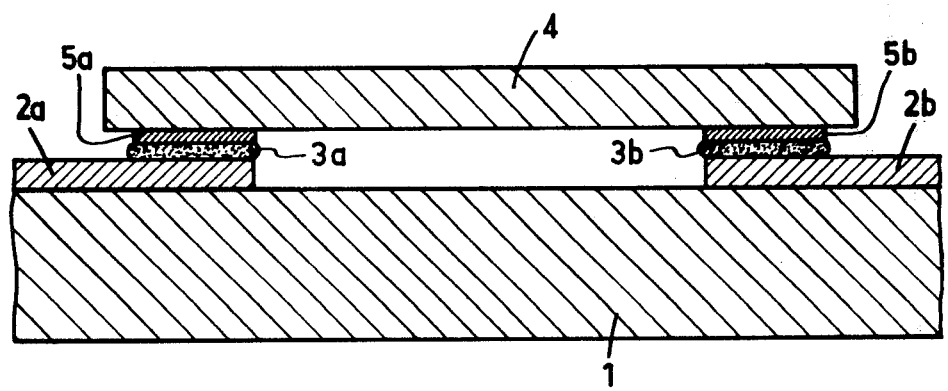
FIG. 3 is a sectional view of a semiconductor crystal provided on the substrate.

FIG. 3 shows the same substrate 1 and the metallizations 2a and 2b thereof, but now heated to 170° C.±5° C. The metallizations 5a and 5b of a semiconductor element 4 are now provided on the polymerized drops 3a and 3b. Pressure is then exerted, as a result of which the metallizations 5a and 5b are pressed against the polymerized drops 3a and 3b, which pressure is maintained for 2 to 3 seconds and which is substantially equal to 100 grams per contact pad when the contact pads have a dimension of 100×100 micrometers. A vacuum pipette (not shown in the drawing) which serves in known manner for maintaining, placing and pressing the semiconductor element 4 is heated at 400° C.±5° C. A pipette having a flat end is preferably used so as to prevent the semiconductor element bearing against said end from breaking. The conductive drops 3a and 3b are squeezed, as a result of which both the mechanical connection and the electrical connection of the semiconductor element 4 and the substrate 1 are ensured by a phenomenon which is analogous to that of thermocompression. If the metal of the contact pads 5a and 5b should have an oxide skin, this is pierced during the bonding in accordance with thermocompression.

The method described thus is mainly characterized in that first the polymerization of the conductive paste 3a, 3b is produced and that the polymerized conductive paste is compressed between each contact pad 2a, 2b of an element and the corresponding contact pad 5a, 5b of the other element, while at least one of the elements, 1, 4 is heated and that the polymerization of the paste 3a, 3b is produced before the two elements 1, 4 are positioned against each other with their contact pads.

In a modified embodiment of the method, the semiconductor element 4 is provided against the substrate 1 which is provided with the not yet polymerized semiconductor paste 3a, 3b. Polymerization is then produced, the elements 1, 4 then being in their ultimate mutual positions. Polymerization is carried out, for example, at 150° C. for one hour, in the case of the above-mentioned conductive paste. After the polymerization, the temperature of the substrate is raised to 170°±5° C. and a warm pipette is pressed on the semiconductor element in the same conditions of heat and pressure as described above.

In the example described, the contact pads 5a, 5b of the semiconductor element 4 are of aluminum, the contact pads 2a, 2b of the substrate 1 are of gold and the glue is filled with gold, but it will be obvious that the method may be used on assemblies having other metals without departing from the scope of this invention. For example, the following metals or alloys of these metals may be used: copper, nickel, chromium, titanium, germanium, silicon, molybdenum, cobalt, tin, cadmium, silver, platinum and palladium.

In the above-described, in a crystal of an integrated circuit of type μA 741 having 7 contact pads of 100×100 micrometers, the electrical connection was obtained with a pressure of 700 to 800 grams and the assembly thus manufactured maintained its qualities after a duration test of 1000 hours at 150° C.

What is claimed is:

1. A method for simultaneously electrically connecting two semiconductor elements each having a plurality of mutually-opposing contact pad metallizations, which comprises:

applying an electrically-conductive paste to each of said contact pad metallizations on at least one of said two elements; then polymerizing said electrically-conductive paste; then compressing said polymerized electrically-conductive paste between the mutually-opposing contact pad metallizations of said two elements; and heating at least one of said two elements being connected during compression.

2. A method as claimed in claim 1, wherein the contact pad metallization on at least one semiconductor element comprises a conductive material selected from the group consisting of aluminum, copper, nickel, gold, titanium, germanium, silicon, molybdenum, chromium, cobalt, tin, cadmium, silver, platinum, palladium, alloys of silver-palladium, silver-platinum, cobalt-tin, cobalt-nickel, gold-copper-cadmium, gold-silver, titanium-gold, and gold-vanadium.

3. A method as claimed in claim 1 or 2, wherein said electrically-conductive paste comprises an epoxy resin filled with silver particles.

4. A method as claimed in claim 1 or 2, wherein said electrically-conductive paste comprises an epoxy resin filled with gold particles.

* * * * *